United States Patent
Chen et al.

(10) Patent No.: US 11,302,686 B2
(45) Date of Patent: Apr. 12, 2022

(54) HIGH-VOLTAGE CIRCUITRY DEVICE AND RING CIRCUITRY LAYOUT THEREOF

(71) Applicant: Nuvoton Technology Corporation, Hsinchu Science Park (TW)

(72) Inventors: Yi-Hao Chen, Taichung (TW); Tsu-Yi Wu, Tainan (TW); Chih-Hsun Lu, Dongshan Township, Yilan County (TW); Po-An Chen, Toufen (TW); Chun-Chieh Liu, Jhubei (TW)

(73) Assignee: Nuvoton Technology Corporation, Hsinchu Science Park (TW)

( * ) Notice: Subject to any disclaimer, the term of this patent is extended or adjusted under 35 U.S.C. 154(b) by 169 days.

(21) Appl. No.: 16/687,328

(22) Filed: Nov. 18, 2019

(65) Prior Publication Data

US 2021/0035969 A1 Feb. 4, 2021

(30) Foreign Application Priority Data

Aug. 2, 2019 (TW) ................................. 108127466

(51) Int. Cl.
*H01L 27/02* (2006.01)
*H02H 9/04* (2006.01)

(52) U.S. Cl.
CPC ......... *H01L 27/0248* (2013.01); *H02H 9/045* (2013.01); *H01L 27/027* (2013.01); *H01L 27/0255* (2013.01); *H01L 27/0266* (2013.01)

(58) Field of Classification Search
CPC .............. H01L 27/0255; H01L 27/0266; H01L 27/027
USPC .................... 361/56, 91.1, 111; 257/355, 360
See application file for complete search history.

(56) References Cited

U.S. PATENT DOCUMENTS

| | | | | |
|---|---|---|---|---|
| 6,459,553 B1 * | 10/2002 | Drapkin | ............... | H01L 27/0266 257/355 |
| 6,671,153 B1 * | 12/2003 | Ker | ...................... | H01L 27/0255 361/111 |
| 7,190,563 B2 * | 3/2007 | Shibib | .................. | H01L 27/0266 361/111 |
| 7,804,669 B2 * | 9/2010 | Worley | ............... | H01L 27/0266 361/56 |

(Continued)

FOREIGN PATENT DOCUMENTS

| | | |
|---|---|---|
| CN | 102761109 B | 3/2015 |
| TW | 201611293 A | 3/2016 |

*Primary Examiner* — Gary A Nash
(74) *Attorney, Agent, or Firm* — Muncy, Geissler, Olds & Lowe, P.C.

(57) ABSTRACT

A high-voltage circuitry device is provided. The high-voltage circuitry device includes a high-voltage transistor, a protection component and a feedback component. The high-voltage transistor has a gate, a drain and a source. The protection component is coupled between the source of the high-voltage transistor and the ground. When a current corresponding to an electrostatic discharge (ESD) event flows through the drain of the high-voltage transistor, the current flows from the drain of the high-voltage transistor to the ground through the high-voltage transistor and the protection component. The feedback component is coupled between the protection component, the ground and the gate of the high-voltage transistor. When the ESD event occurs, the feedback component enables the high-voltage transistor to stay on a turned-on state to pass the current.

19 Claims, 4 Drawing Sheets

(56) References Cited

U.S. PATENT DOCUMENTS

| | | | |
|---|---|---|---|
| 9,013,842 B2* | 4/2015 | Domanski | H01L 27/0285 |
| | | | 361/56 |
| 9,953,968 B2 | 4/2018 | Cao et al. | |
| 2002/0154462 A1* | 10/2002 | Ker | H01L 27/0274 |
| | | | 361/56 |
| 2005/0237681 A1* | 10/2005 | Chen | H02H 9/046 |
| | | | 361/56 |
| 2009/0091871 A1* | 4/2009 | Hung | H02H 9/046 |
| | | | 361/56 |
| 2012/0275072 A1* | 11/2012 | Chen | H01L 29/87 |
| | | | 361/56 |
| 2013/0214333 A1 | 8/2013 | Rountree | |
| 2015/0325568 A1 | 11/2015 | Chaudhry et al. | |
| 2017/0019262 A1 | 1/2017 | Horáth et al. | |
| 2018/0102357 A1* | 4/2018 | Kim | H01L 29/7818 |

* cited by examiner

HIGH-VOLTAGE CIRCUITRY DEVICE AND RING CIRCUITRY LAYOUT THEREOF

CROSS REFERENCE TO RELATED APPLICATIONS

This application claims priority of Taiwan Patent Application No. 108127466, filed on Aug. 2, 2019, the entirety of which is incorporated by reference herein.

BACKGROUND OF THE INVENTION

Field of the Invention

The invention relates to a high-voltage circuitry device and a ring circuitry layout thereof, and more particularly to a high-voltage circuitry device and a ring circuitry layout thereof with electrostatic discharge (ESD) protection.

Description of the Related Art

In general, various electronic devices are built with mechanisms for electrostatic discharge (ESD) protection, so as to prevent damage due to the instantaneous passage through the circuitry of a large current generated by electrostatic discharge after the device comes into contact with a human body that has accumulated too much static electricity. These mechanisms for electrostatic discharge (ESD) protection may also help ensure that the electronic device will continue to work properly despite experiencing electrostatic effects from the environment or shipping tools.

A high-voltage component can be generally applied to an electronic device in a high-voltage operating environment, thereby providing high-voltage processing capability. Furthermore, when the electronic device is not operating, the high-voltage component itself can withstand an electrostatic discharge current without causing damage to the device itself.

However, the high-voltage component cannot provide effective ESD protection, and therefore when an ESD event occurs, generating an instantaneous large current, the high-voltage component cannot be used to reliably prevent damage to the electronic device caused by the ESD event. Therefore, the instantaneous large current generated in the ESD event may still flow to other internal circuits through the high-voltage component, causing those components in the internal circuit to become damaged.

BRIEF SUMMARY OF THE INVENTION

A high-voltage circuitry device and a ring circuitry layout thereof are provided. An embodiment of a high-voltage circuitry device is provided. The high-voltage circuitry device includes a high-voltage transistor, a protection component and a feedback component. The high-voltage transistor has a gate, a drain and a source. The protection component is coupled between the source of the high-voltage transistor and the ground. When a current corresponding to an electrostatic discharge (ESD) event flows through the drain of the high-voltage transistor, the current flows from the drain of the high-voltage transistor to the ground through the high-voltage transistor and the protection component. The feedback component is coupled between the protection component, the ground and the gate of the high-voltage transistor. When the ESD event occurs, the feedback component enables the high-voltage transistor to stay on a turned-on state to pass the current.

Furthermore, an embodiment of a ring circuitry layout of a high-voltage circuitry device is provided for configuring a high-voltage transistor, a protection component, and a feedback component of the high-voltage circuit device. The high-voltage transistor, the protection component and the feedback component are fabricated on the same semiconductor substrate by the same semiconductor process. The ring circuitry layout includes a central portion and a surrounding portion surrounding the central portion. The central portion includes a drain of the high-voltage transistor. The surrounding portion includes a gate and a source of the high-voltage transistor, the ground, the protection component and the feedback component. When an electrostatic discharge (ESD) event occurs, the feedback component is configured to enable the high-voltage transistor to stay on a turned-on state to pass the current caused by the ESD event.

Moreover, an embodiment of a high-voltage circuitry device is provided. The high-voltage circuitry device includes a high-voltage transistor, a protection component and a feedback component. The protection component is coupled between a source of the high-voltage transistor and a ground. When a current corresponding to an electrostatic discharge (ESD) event flows through the drain of the high-voltage transistor, the current flows from the drain of the high-voltage transistor to the ground through the high-voltage transistor and the protection component. The feedback component includes a capacitor and a resistor. The capacitor is coupled between a gate of the high-voltage transistor and the protection component. The resistor is coupled between the gate of the high-voltage transistor and the ground. when the ESD event occurs, the high-voltage transistor is enabled by the feedback component to pass the current.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The following disclosure provides many different embodiments or features of different exemplary embodiments. The following disclosure describes specific examples of the respective components and their arrangement, in order to simplify the description. Of course, these specific examples are not limited thereto. For example, if the present disclosure describes a first feature is formed on or over a second feature, it means that it may contain the first feature and the second feature are characterized in direct contact, also may contain additional feature formed on the first feature, so that the first and second features may not be direct contact. In the following different examples, the disclosure may repeat the same reference symbols and/or numerals. These are repeated for simplicity and clarity, not intended to have a specific relationship between the various embodiments and/or configurations discussed defined.

Figure 1:
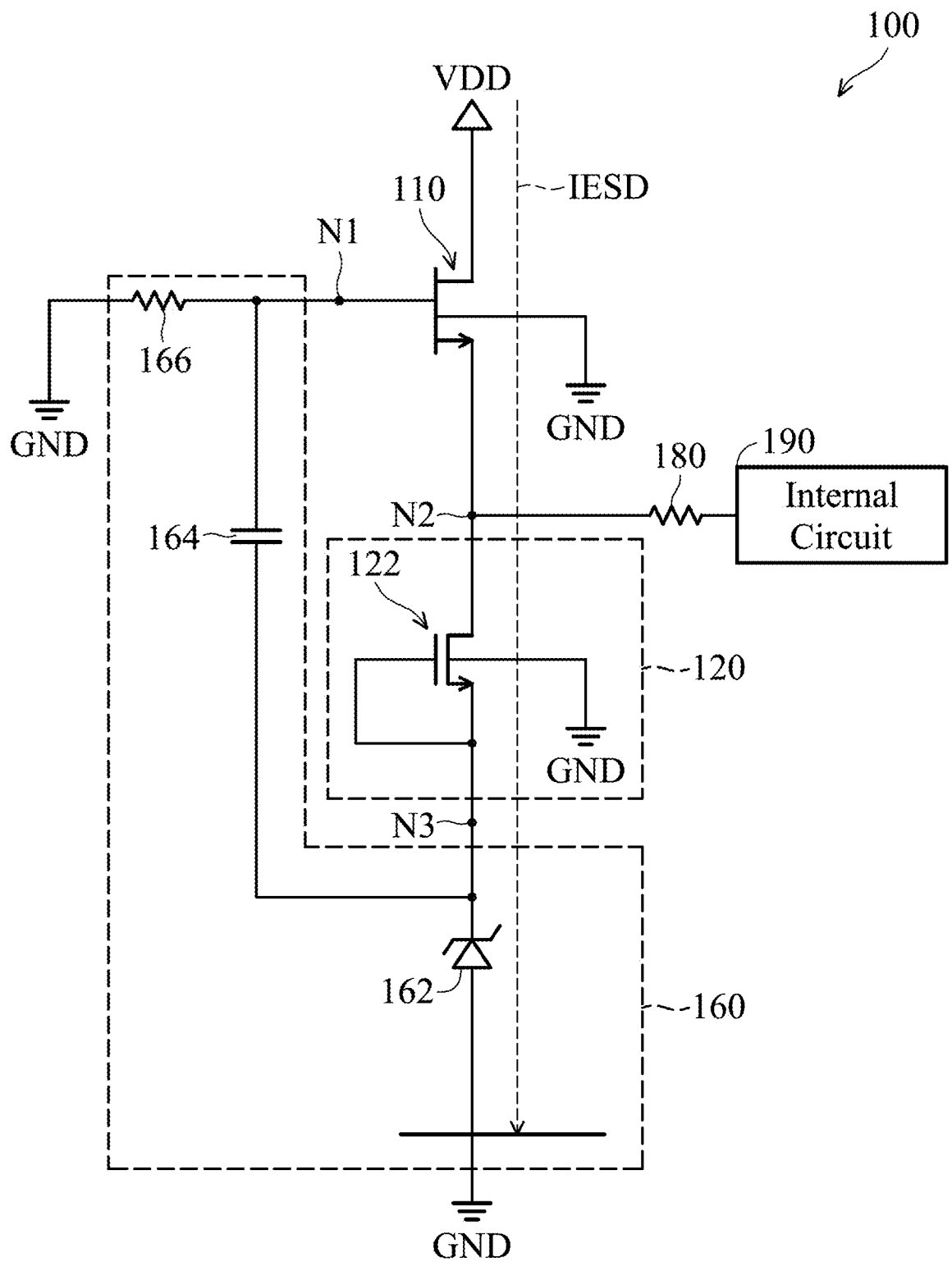
FIG. 1 shows a high-voltage circuitry device according to an embodiment of the invention.

FIG. 1 shows a high-voltage circuitry device 100 according to an embodiment of the invention. The high-voltage circuitry device 100 includes a high-voltage transistor 110, a protection component 120 and a feedback component 160. The protection component 120 and feedback component 160 can be implemented with the high-voltage transistor 110 to save wafer area. Generally, the high-voltage transistor 110 is an element that can operate at voltages above 3V (volts) or 5V. More specifically, the high-voltage component or the high-voltage transistor in the embodiments of the invention may be, for example, operated in an environment of ten volts, several tens of volts, several hundred volts or even several kilovolts.

For example, the high-voltage circuitry device 100 can be a voltage converting circuit, such as a low dropout regulator (LDO), which can be applied to a power supply, a DC to DC voltage converter (DC/DC converter) or a power amplifier that requires voltage conversion. The high-voltage circuitry 100 can also be fabricated in a single chip in the form of an integrated circuit (IC) or integrated with other circuits.

The high-voltage transistor 110 has a gate connected to a node N1, a drain connected to a voltage source VDD, and a source connected to a node N2. In detail, the high-voltage transistor 110 can provide a voltage conversion function. The high-voltage transistor 110 includes a junction gate field-effect transistor (JFET). The high-voltage transistor 110 is controlled by a control circuit connected to the gate, and receives an external voltage source VDD from a voltage input/output terminal, so as to generate an operating voltage with a relatively low voltage level at one terminal (i.e., the node N2) of the high-voltage transistor 110, so that the internal circuit 190 can operate in accordance with the operating voltage. Furthermore, the internal circuit 190 is connected to the node N2 and the source of the high-voltage transistor 110 through the resistor 180.

The protection component 120 is coupled between the source of the high-voltage transistor 110 and the ground. When the current IESD that corresponds to an electrostatic discharge (ESD) event flows through the drain of the high-voltage transistor 110, the current IESD flows from the drain of the high-voltage transistor 110 to the ground GND through the high-voltage transistor 110 and the protection component 120. Furthermore, the feedback component 160 is coupled between the protection component 120, the ground GND, and the gate of the high-voltage transistor 110. When the ESD event occurs, the high-voltage transistor 110 stays on a turned-on state for the current IESD to prevent the ESD event from damaging the high-voltage circuitry device 100.

In one embodiment, the protection component 120 includes a Metal-Oxide-Semiconductor Field-Effect Transistor (MOSFET), a Bipolar Junction Transistor (BJT) or a diode. In the embodiment of FIG. 1, the protection component 120 includes a MOSFET 122. The drain of the MOSFET 122 is connected to the node N2 to couple the high-voltage transistor 110, and the source of the MOSFET 122 is connected to the node N3 to couple the feedback component 160.

It is to be noted that the MOSFET 122 is N-type, and the gate of the MOSFET 122 is connected to the source of the MOSFET 122. Therefore, when no ESD event occurs, the gate of the MOSFET 122 is turned off, and the high-voltage circuitry device 100 can operate normally. In another embodiment, the protection component 120 includes a Zener diode having an anode connected the node N3 to couple the feedback component 160 and a cathode connected the node N2 to couple the high-voltage transistor 110. Furthermore, the protection component 120 may also include a Silicon Controlled Rectifier (SCR) or a parasitic SCR control circuit, wherein the SCR is an electronic component with P/N/P/N semiconductor interface, and the invention is not limited thereto.

In one embodiment, the feedback component 160 includes a Zener diode 162. The anode of the Zener diode 162 is coupled to the ground GND, and the cathode of the Zener diode 162 is coupled to the node N3 to couple the protection component 120. In the embodiment shown in FIG. 1, the feedback component 160 further includes a capacitor 164 and a resistor 166, and the gate of the high-voltage transistor 110 is connected to the node N1 to couple the capacitor 164 and the resistor 166. For example, the resistor 166 may be a poly resistor, a diffusion resistor, a well resistor, or the like, or may be implemented by a transistor, and the invention is not limited thereto.

It should be noted that when no ESD event occurs, the voltage of the node N2 is less than the ESD trigger voltage, thus the ESD protection mechanism is not activated, and the protection component 120 is turned off, so that the high-voltage transistor 110 and the internal circuit 190 are operated normally. When the ESD event occurs, a large amount of electrostatic charge and its corresponding current IESD are generated in a short time, and flow from the drain of the high-voltage transistor 110 through the source of the high-voltage transistor 110, so that the voltage of the node N2 is greater than or equal to the ESD trigger voltage, and then the ESD protection mechanism is started. At this time, the protection component 120 and the feedback component 160 are turned on, so that the current IESD corresponding to the ESD charge can flow to the MOSFET 122 as much as possible, thus the current IESD corresponding to the ESD charge is effectively discharged through the MOSFET 122. Moreover, the Zener diode 162 of the feedback component 160 is reverse-biased.

In general, the breakdown voltage of the reverse-biased Zener diode 162 is fixed and predictable. At this time, the breakdown voltage of the Zener diode 162 is transmitted to the gate of the high-voltage transistor 110 to turn on the high-voltage transistor 110. In other words, the Zener diode 162 clamps the voltage and feedback the voltage to the high-voltage transistor 110 through the feedback network. It is ensured that the high-voltage transistor 110 is normally turned on when the ESD event occurs, and the high-voltage transistor 110 and the internal circuit 190 are prevented from being damaged by a large amount of electrostatic charges.

In the original structure of the high-voltage transistor 110, since the ability of the internally parasitic reverse-biased diode to drain the current IESD is generally weak, the current IESD corresponding to the ESD event can still cause damage to the drain and the gate of the high-voltage transistor 110. Therefore, the high-voltage circuitry 100 of the present invention is designed to use the protection component 120 and the feedback component 160 at the source of the high-voltage transistor 110 by utilizing the channel characteristics of the normally open type JFET. Thus, the gate voltage of the high-voltage transistor 110 is clamped by the feedback component 160, and the high-voltage transistor 110 stays on a turned-on state, thus the current IESD is drained to the ground GND through the protection component 120, thereby providing the ESD protection with high stability and high efficiency.

Figure 2:
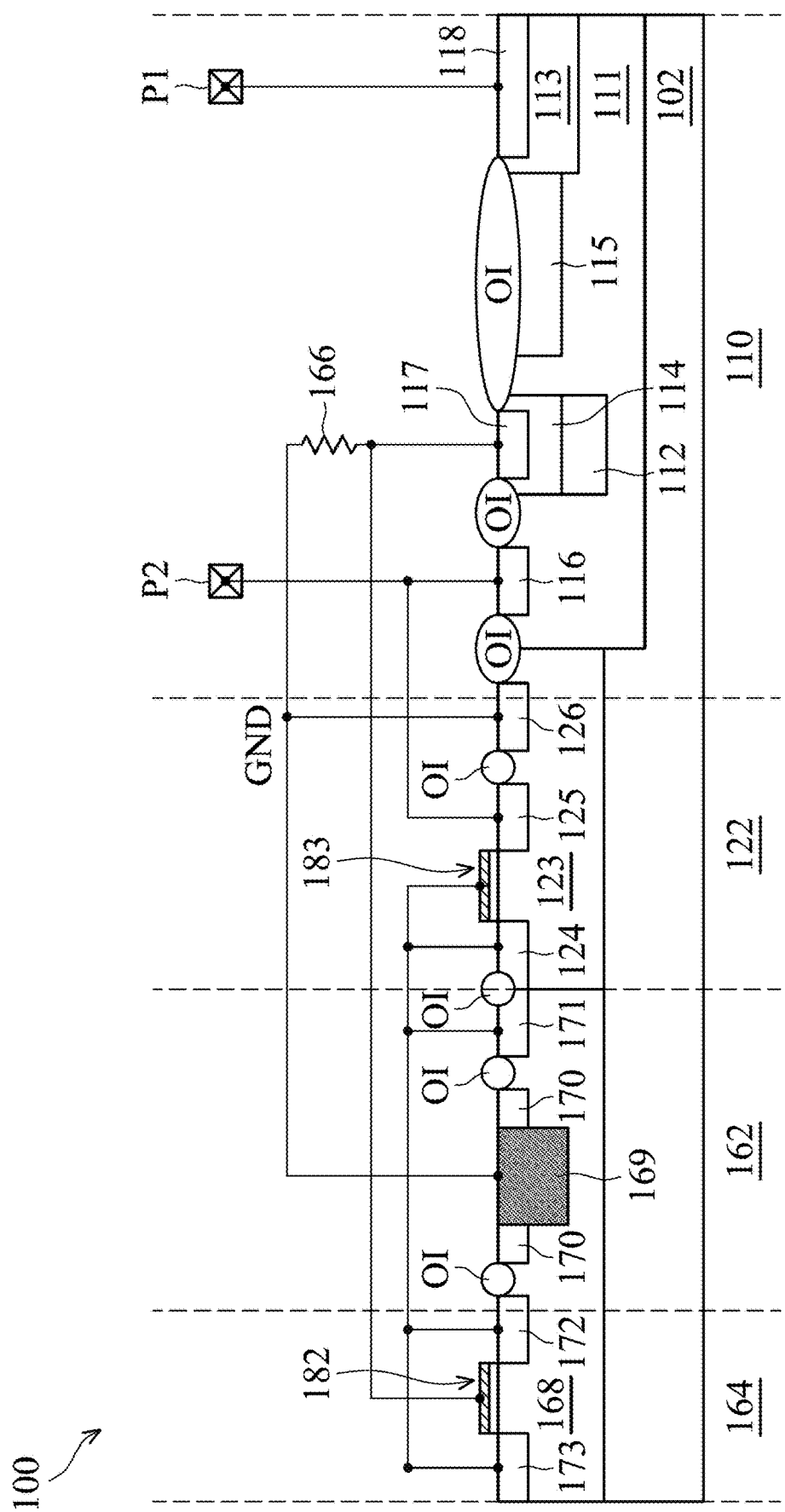
FIG. 2 shows a structure of the high-voltage circuitry device according to an embodiment of the invention.

FIG. 2 shows a structure of the high-voltage circuitry device 100 according to an embodiment of the invention. As shown in FIG. 2, both the protection component 120 and the feedback component 160 can be integrated with the high-voltage transistor 110, and can be integrated into the same planar structure in particular in a laterally fabricated manner. Specifically, the protection component 120, the feedback component 160, and the high-voltage transistor 110 can share a semiconductor layer so that the three components are laterally integrated into the same planar structure. For example, when the protection component 120, the feedback component 160, and the high-voltage transistor 110 are each implemented by a junction gate field-effect transistor (JFET), a MOS field effect transistor (LDMOS), a high-voltage MOS field effect transistor (HVMOS), a bipolar junction transistor, or a Zener diode, any two of the protection component 120, the feedback component 160, and the high-voltage transistor 110 can share a doped layer, a heavily doped layer, a substrate, or an electrode, and the same semiconductor processes are used together to reduce the complexity of the process and the number of masks required.

In the embodiment shown in FIG. 2, the high-voltage transistor 110, the MOSFET 122, the Zener diode 162, and the capacitor 164 are formed on the P-type substrate 102. Then, an N-type heavy doped well region 111, a P-type well region 123, and an N-type well region 168 are formed over the substrate 102 and adjacent to each other. The doping concentration of the N-type heavy doped well region 111 is greater than the doping concentration of the P-type well region 123 and the N-type well region 168.

For the high-voltage transistor 110, a P-type well region 112, an N-type well region 113, and P-type diffusion drift regions 114 and 115 are formed in the N-type heavy doped well region 111. The N-type well region 113 is adjacent to the P-type diffusion drift region 115, and the P-type diffusion drift region 114 is located on the P-type well region 112. Then, as shown in FIG. 2, a P-type heavy doped region 117 and the N-type heavy doped regions 116 and 118 are formed in the P-type diffusion drift region 114, the N-type heavy doped well region 111, and the N-type well region 113 as the gate, the source and the drain of the high-voltage transistor 110, respectively. Furthermore, the N-type heavy doped region 118 is connected to the voltage source VDD through the input/output terminal P1, and the N-type heavy doped region 116 is connected to the internal circuit 190 through the input/output terminal P2.

For the MOSFET 122, the P-type heavy doped region 126 and the N-type heavy doped regions 124 and 125 are formed in the P-type well region 123 as the bulk, the source and the drain of the MOSFET 122. Moreover, the gate electrode 183 is disposed between the two N-type heavy doped regions 124 and 125. In one embodiment, the P-type heavy doped region 126 also serves as the bulk shared by the MOSFET 122 and the high-voltage transistor 110, and the bulk is connected to the ground GND. In one embodiment, the doping concentrations and lengths of the P-type heavy doped region 126, the N-type heavy doped regions 124 and 125, and the P-type well region 123 may affect the breakdown voltage and on-resistance (Ron) of the protection component 120.

For the Zener diode 162, a P-type heavy doped region 170, a Zener contact region 169, and an N-type heavy doped region 171 are all formed in the N-type well region 168. For the capacitor 164, the N-type heavily doped regions 172 and 173 are both formed in N-well region 168. The gate electrode 182 is disposed between the two N-type heavy doped regions 172 and 173. In addition, a plurality of field oxide layers OI are disposed between the adjacent N-type and P-type heavy doped regions for electrical isolation. In practice, the field oxide layer is formed by a local oxidation of silicon (LOCOS). In some embodiments, the doping type of the Zener contact region 169 is N-type, and the element that may be used is phosphorus (P).

Figure 3A:
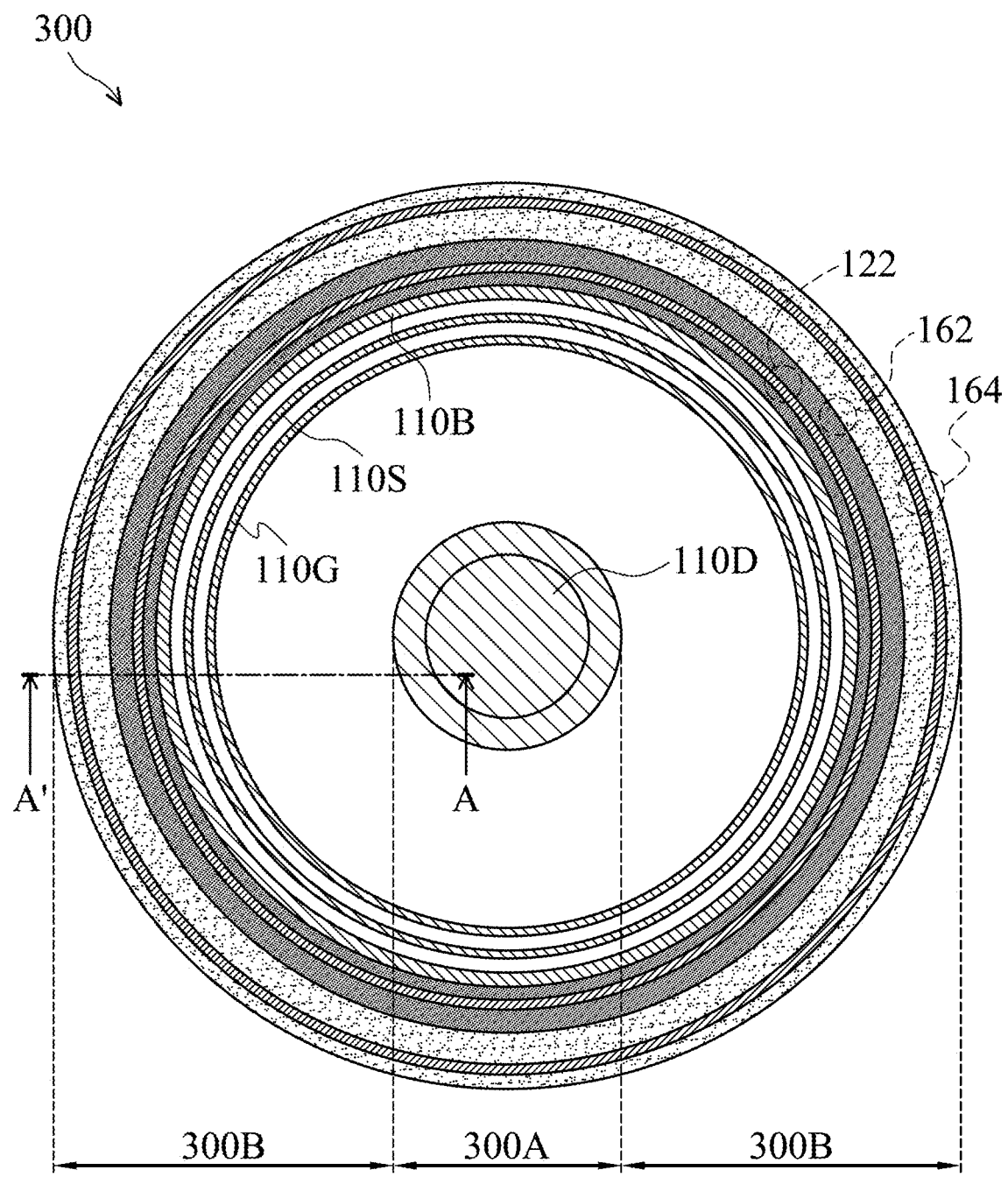
FIG. 3A shows a ring circuitry layout of the high-voltage circuitry device according to an embodiment of the invention.
Figure 3B:
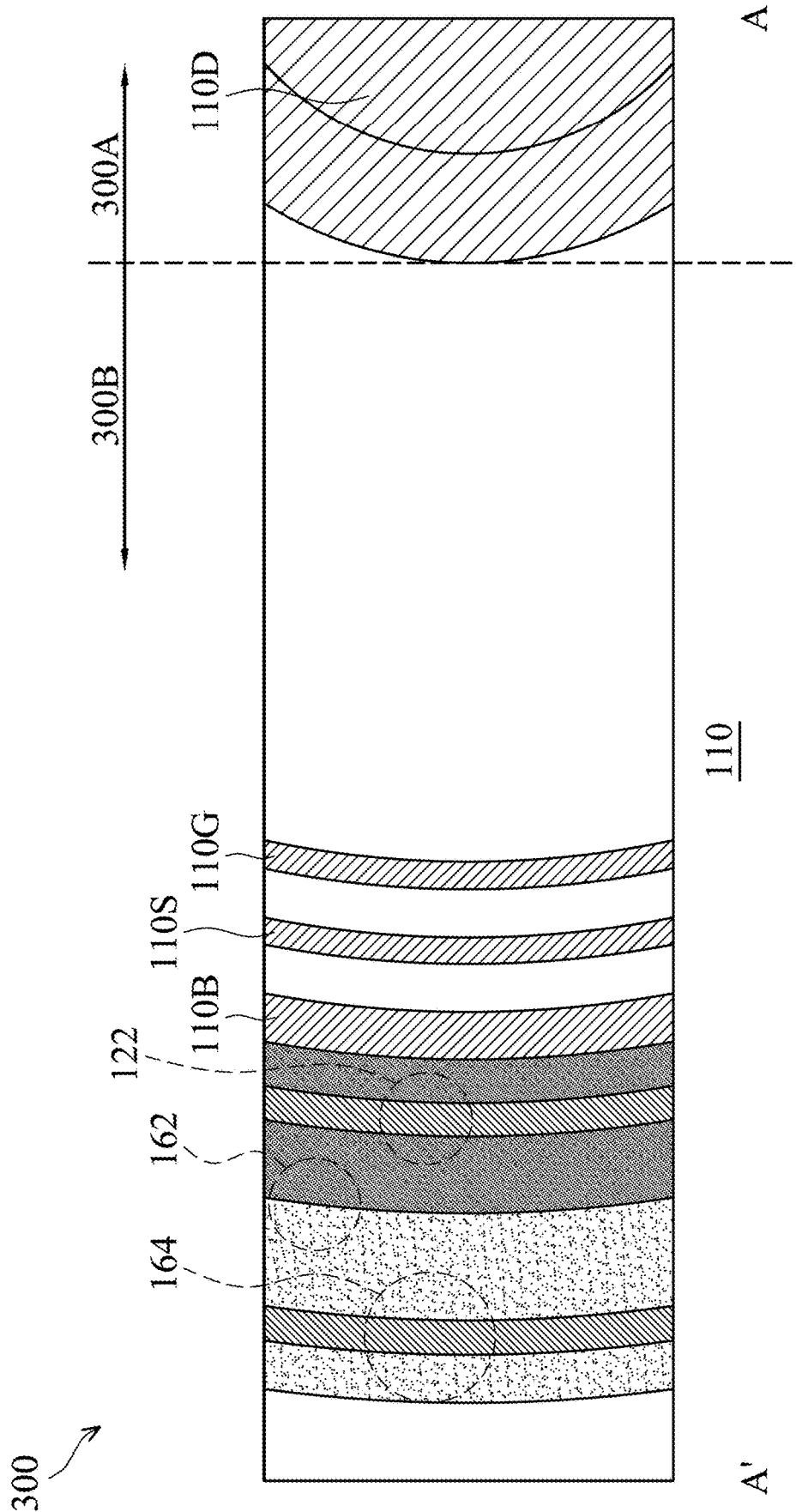
FIG. 3B shows a zoom-in diagram illustrating the ring circuitry layout of the high-voltage circuitry device according to an embodiment of the invention.

FIG. 3A shows a ring circuitry layout 300 of the high-voltage circuitry device 100 according to an embodiment of the invention. FIG. 3B shows a zoom-in diagram illustrating the ring circuitry layout 300 of the high-voltage circuitry device 100 according to an embodiment of the invention, wherein FIG. 3B shows a cross-sectional view of the semiconductor structure of the ring circuitry layout 300 along line A-A' in FIG. 3A. In the embodiment, the ring circuitry layout 300 includes a central portion 300A and a surrounding portion 300B surrounding the central portion 300A.

As shown in FIGS. 3A and 3B, the central portion 300A includes the drain 110D of the high-voltage transistor 110 (e.g., the N-type heavy doped region 118). The surrounding portion 300B includes the gate 110G (e.g., the P-type heavy doped region 117) and the source 110S (e.g., the N-type heavily doped region 116) of the high-voltage transistors 110, the ground GND, and the protection component 120, and the feedback component 160. When an ESD event occurs, the feedback component 160 is used to maintain the high-voltage transistor 110 in a turned-on state to flow a current ESD generated by the ESD event. The ESD protection and feedback mechanism are as described above, and will not be described here.

In the embodiment shown in FIGS. 3A and 3B, the gate 110G of the high-voltage transistor 110 surrounds the drain 110D of the high-voltage transistor 110, and the source 110S of the high-voltage transistor 110 surrounds the gate 110G of the voltage transistor 110. Furthermore, the bulk 110B (e.g., the p-type heavy doped region 126) (connected to the ground GND) surrounds the source 110S of the high-voltage transistor 110, and the protection component 120 (e.g., the MOSFET 122) surrounds the ground GND. The feedback component 160 (e.g., the Zener diode 162) surrounds the protection component 120, and then the capacitor 164 surrounds the Zener diode 162.

In one embodiment, the ESD protection capability of the protection component 120 is proportional to the channel width of the MOSFET 122. In another embodiment, the ESD protection capability of the protection component 120 is proportional to the product of the channel width of the MOSFET 122 multiplied by the channel length of the MOSFET 122. In another embodiment, the ESD protection capability of the protection component 120 is proportional to the aspect ratio of the channel width to the channel length of the MOSFET 122.

It is to be noted that the MOSFET 122 of the protection component 120 is disposed in the surrounding region 300B, and the high-voltage transistor 110 is disposed in the central region 300A and a portion of the surrounding region 300B. In other words, in the circuit layout, the MOSFET 122 is disposed on the periphery of the high-voltage transistor 110, and the Zener diode 162 is disposed on the periphery of the MOSFET 122. Thus, the protection component 120 and the feedback component 160 can have a large channel width to provide good and reliable ESD protection for the high-voltage transistor 110 of the high-voltage circuitry device 100 and the internal circuitry 190.

Furthermore, for the layout of the integrated circuit chip (e.g., the polygonal structure layout and the circular structure layout), the manner in which the high-voltage transistor 110, the protection component 120, and the feedback component 160 are integrated in the present invention is a general layout method, and the total integration area can be about the same as that required for the high-voltage transistor itself. Therefore, provided that the total area is substantially unchanged, the ESD protection of the whole circuit can be effectively enhanced, the ability to drain a large current of ESD can be improved, and the original operation and function of the whole circuit can be maintained.

The ordinal numbers in the disclosure and the scope of the patent application, such as "first", "second", "third", etc., have no sequential relationship with each other, and are only used to distinguish between two different components with the same name. The term "coupled" in the disclosure refers to a variety of direct or indirect electrical connections.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high-voltage circuitry device, comprising:
a high-voltage transistor, having a gate, a drain and a source;
a protection component coupled between the source of the high-voltage transistor and a ground, wherein when a current corresponding to an electrostatic discharge (ESD) event flows through the drain of the high-voltage transistor, the current flows from the drain of the high-voltage transistor to the ground through the high-voltage transistor and the protection component; and
a feedback component coupled between the protection component, the ground and the gate of the high-voltage transistor, and configured to enable the high-voltage transistor to stay on a turned-on state to pass the current when the ESD event occurs,
wherein the feedback component comprises a Zener diode, wherein an anode of the Zener diode is coupled to the ground, and a cathode of the Zener diode is coupled to the protection component.

2. The high-voltage circuitry device as claimed in claim 1, wherein when the ESD event occurs, the Zener diode is reverse-biased, and a breakdown voltage of the Zener diode is transmitted to the gate of the high-voltage transistor to turn on the high-voltage transistor.

3. The high-voltage circuitry device as claimed in claim 2, wherein the feedback component further comprises a capacitor and a resistor, and the gate of the high-voltage transistor is coupled to the capacitor and the resistor.

4. The high-voltage circuitry device as claimed in claim 1, wherein the high-voltage transistor comprises a junction gate field-effect transistor, and the protection component comprises a Metal-Oxide-Semiconductor Field-Effect Transistor (MOSFET), a Bipolar Junction Transistor (BJT) or a diode.

5. The high-voltage circuitry device as claimed in claim 4, wherein the protection component comprises the MOSFET, and a gate of the MOSFET is coupled to a source of the MOSFET.

6. The high-voltage circuitry device as claimed in claim 4, wherein a protection capability of the protection component is proportional to a channel width of the MOSFET, the product of the channel width of the MOSFET multiplied by a channel length of the MOSFET, or an aspect ratio of the channel width of the MOSFET to the channel length of the MOSFET.

7. The high-voltage circuitry device as claimed in claim 1, wherein the high-voltage transistor, the protection component and the feedback component are fabricated on the same semiconductor substrate by the same semiconductor process.

8. A ring circuitry layout of a high-voltage circuitry device for configuring a high-voltage transistor, a protection component, and a feedback component of the high-voltage circuit device, wherein the high-voltage transistor, the protection component and the feedback component are fabricated on the same semiconductor substrate by the same semiconductor process, and the ring circuitry layout comprises:
a central portion, comprising a drain of the high-voltage transistor; and
a surrounding portion surrounding the central portion, and comprising a gate and a source of the high-voltage transistor, a ground, the protection component and the feedback component,
wherein when an electrostatic discharge (ESD) event occurs, the feedback component is configured to enable the high-voltage transistor to stay on a turned-on state to pass the current caused by the ESD event.

9. The ring circuitry layout of the high-voltage circuitry device as claimed in claim 8, wherein the gate of the high-voltage transistor surrounds the drain of the high-voltage transistor, the source of the high-voltage transistor surrounds the gate of the high-voltage transistor, the ground surrounds the source of the high-voltage transistor, the protection component surrounds the ground, and the feedback component surrounds the protection component.

10. The ring circuitry layout of the high-voltage circuitry device as claimed in claim 9, wherein the high-voltage transistor comprises a junction gate field-effect transistor, the protection component comprises a Metal-Oxide-Semiconductor Field-Effect Transistor (MOSFET), and the feedback component comprises a Zener diode.

11. The ring circuitry layout of the high-voltage circuitry device as claimed in claim 10, wherein the high-voltage transistor and the protection component share a bulk coupled to the ground.

12. The ring circuitry layout of the high-voltage circuitry device as claimed in claim 10, wherein the feedback component further comprises a capacitor, and the capacitor surrounds the Zener diode of the feedback component.

13. The ring circuitry layout of the high-voltage circuitry device as claimed in claim 10, wherein a protection capability of the protection component is proportional to a channel width of the MOSFET, the product of the channel width of the MOSFET multiplied by a channel length of the MOSFET, or an aspect ratio of the channel width of the MOSFET to the channel length of the MOSFET.

14. The ring circuitry layout of the high-voltage circuitry device as claimed in claim 8, wherein when the current caused by the ESD event flows through the drain of the high-voltage transistor, the current flows from the drain of the high-voltage transistor to the ground through the high-voltage transistor and the protection component.

15. A high-voltage circuitry device, comprising:
a high-voltage transistor;
a protection component coupled between a source of the high-voltage transistor and a ground, wherein when a current corresponding to an electrostatic discharge (ESD) event flows through the drain of the high-voltage transistor, the current flows from the drain of the high-voltage transistor to the ground through the high-voltage transistor and the protection component; and
a feedback component, comprising:
  a capacitor coupled between a gate of the high-voltage transistor and the protection component; and
  a resistor coupled between the gate of the high-voltage transistor and the ground,
wherein when the ESD event occurs, the high-voltage transistor is enabled by the feedback component to pass the current.

16. The high-voltage circuitry device as claimed in claim 15, wherein the feedback component further comprises a Zener diode, wherein an anode of the Zener diode is coupled to the ground, and a cathode of the Zener diode is coupled to the protection component.

17. The high-voltage circuitry device as claimed in claim 16, wherein when the ESD event occurs, the Zener diode is reverse-biased, and a breakdown voltage of the Zener diode is transmitted to the gate of the high-voltage transistor to turn on the high-voltage transistor.

18. The high-voltage circuitry device as claimed in claim 15, wherein the high-voltage transistor comprises a junction gate field-effect transistor, and the protection component comprises a Metal-Oxide-Semiconductor Field-Effect Transistor (MOSFET), a Bipolar Junction Transistor (BJT) or a diode.

19. The high-voltage circuitry device as claimed in claim 18, wherein a protection capability of the protection component is proportional to a channel width of the MOSFET, the product of the channel width of the MOSFET multiplied by a channel length of the MOSFET, or an aspect ratio of the channel width of the MOSFET to the channel length of the MOSFET.

* * * * *